United States Patent [19]

Lessoff et al.

[11] Patent Number: 4,843,060

[45] Date of Patent: Jun. 27, 1989

[54] METHOD FOR GROWING PATTERNED THIN FILMS OF SUPERCONDUCTORS

[75] Inventors: Howard Lessoff, Potomac; Richard F. Greene, Bethesda, both of Md.

[73] Assignee: The United States of America as represented by the Secretary of the Navy, Washington, D.C.

[21] Appl. No.: 123,629

[22] Filed: Nov. 23, 1987

[51] Int. Cl.$^4$ .............................................. B05D 5/12
[52] U.S. Cl. .......................................... 505/1; 427/62; 427/63; 427/53.1; 427/226; 427/314
[58] Field of Search ................. 427/53.1, 63, 62, 226, 427/314; 501/1

[56] References Cited

U.S. PATENT DOCUMENTS 3,801,366  4/1974  Lemelson ............................ 427/53.1
4,316,785  2/1982  Suzuki et al. .......................... 427/63
4,395,436  7/1983  Bianchi et al. ...................... 427/53.1

OTHER PUBLICATIONS

Kawai et al., *Jap. J. of Appl. Phys. Letters* vol. 26, No. 10, Oct. 1981, pp. L1740–1742.

Primary Examiner—Norman Morgenstern
Assistant Examiner—Margaret Bueker
Attorney, Agent, or Firm—Thomas E. McDonnell; George Jameson

[57] ABSTRACT

A method for growing a patterned superconductive oxide film of the general formula $XZ_2Cu_3O_{6+x}$ is disclosed, wherein X is yttrium, a lanthanide or a mixture thereof, Z is one or more alkaline earth elements and x is a number between 0 and 1. This patterned superconductive oxide film of $XZ_2Cu_3O_{6+x}$ is formed by preparing an aqueous solutuion of the nitrates of X, Z and Cu in the X:Z:Cu stoichiometric ratio of 1:2:3; spraying the aqueous nitrate solution onto a heated substrate to form on the substrate a thin film of $XZ_2Cu_3O_y$ material, wherein y is an undefined number; spot-heating preselected portions of the thin film in an oxygen-rich atmosphere to convert the preselected portions into the patterned superconductive oxide film of $XZ_2Cu_3O_{6+x}$; and removing the unheated thin film of $XZ_2Cu_3O_y$ material with a solvent.

27 Claims, No Drawings

METHOD FOR GROWING PATTERNED THIN FILMS OF SUPERCONDUCTORS

CROSS-REFERENCE TO RELATED APPLICATION

This patent application is related to the co-pending U.S. patent application entitled "Thin Film Growth of Superconducting Materials Using Sprayed Salt Solutions", Ser. No. 123,628, filed Nov. 23, 1987, both of which applications being commonly assigned to the Government of the United States.

BACKGROUND OF THE INVENTION

The present invention relates to superconductive materials and more particularly to a method for growing and patterning superconductive oxide films represented by the general formula $XZ_2Cu_3O_{6+x}$, wherein X is yttruim, a lanthanide or a mixture thereof, Z is one or more alkaline earth elements and x is a number between 0 and 1.

There are several problems involved in growing superconductive oxide films such as, for example, $YBa_2Cu_3O_{6+x}$.

Thin films of the high-Tc superconductivity material $YBa_2Cu_3O_{6+x}$ are difficult to grow because the transport of the elements Y, Ba and Cu in vapor form or in solution is difficult. Some of the reasons for this transport difficulty include:

1. The fact that the elements Y, Ba and Cu or their compounds, and particularly Ba and its compounds, have low vapor pressure.

2. The reactivity of these elements is such that it is difficult to recover them in oxide form. For example, Y reacts with halogens to form very stable oxyhalides.

3. The reactivity of these elements and their compounds at elevated temperatures with boat or ampoule materials leads to contamination of deposited films.

The two most widely investigated techniques for growing thin films of $YBa_2Cu_3O_{6+x}$ with a minimum of contamination are sputtering and evaporation. The layer quality of sputtered or evaporated films has not been good because of the lack of uniformity in the deposited layers. This non-uniformity is caused by the non-uniformity of vapor compositions, as well as by differences in the vapor pressure and sticking coefficients for the various elements.

It should be noted that contamination and/or nonuniformity of the superconductive material $YBa_2Cu_3O_{6+x}$ can lower the Tc of that resultant superconductive material or even prevent the superconductive phase of that material from forming.

In addition to the problems involved in growing the high-Tc superconductivity material $YBa_2Cu_3O_{6+x}$, there is the further difficulty of patterning this superconducting material $YBa_2Cu_3O_{6+x}$.

Therefore, there is a need to deliver intimately mixed stoichiometric ratios of the aforesaid X, $Z_2$ and $Cu_3$ components of the aforesaid general formula $XZ_2Cu_3O_{6+x}$ to a reaction site, such as a substrate, to minimize non-uniformity of the thin film $XZ_2Cu_3O_{6+x}$, and to also grow patterned thin film $XZ_2Cu_3O_{6+x}$ in order to provide superconducting interconnects or conductors with a minimum of contamination from either transport agents or container materials.

OBJECTS OF THE INVENTION

Accordingly, it is an object of the invention to provide a method for forming and patterning an in-situ thin film of the superconductive material $XZ_2Cu_3O_{6+x}$.

Another object of the invention is to provide a method for growing a patterned superconductive oxide films on a substrate.

Another object of the invention is to provide a method for growing patterned superconductive oxide film with a minimum of contamination and non-uniformity of the film.

A further object of the invention is to provide a method for growing an in-situ patterned superconductive oxide film of the general formula $XZ_2Cu_3O_{6+x}$, wherein X is yttrium, a lanthanide or a mixture thereof, Z is one or more alkaline earth elements and x is a number between 0 and 1.

SUMMARY OF THE INVENTION

These and other objects of this invention are achieved by growing a patterned superconductive thin film of $XZ_2Cu_3O_{6+x}$, wherein X is yttrium, a lanthanide or a mixture thereof, Z is one or more alkaline earth elements and x is a number between 0 and 1. This patterned superconductive thin film of $XZ_2Cu_3O_{6+x}$ is formed by preparing an aqueous solution of the nitrates of X, Z and Cu in the X:Z:Cu stoichiometric ratio of 1:2:3; spraying the aqueous nitrate solution onto a substrate heated to a temperature between at least the decomposition temperature of the nitrates in the solution and the lowest temperature above the decomposition temperature at which a film does not form on the substrate, thereby forming on the substrate a thin film of $XZ_2Cu_3O_y$ material, wherein y is an undefined number; spot-heating preselected portions of the thin film in an oxygen-rich atmosphere to convert the preselected portions into the patterned superconductive thin film of $XZ_2Cu_3O_{6+x}$; and removing the unheated thin film of $XZ_2Cu_3O_y$ material with a solvent.

DETAILED DESCRIPTION OF THE INVENTION

The superconducting oxide films that can be prepared by the subject method are represented by the general formula: $XZ_2Cu_3O_{6+x}$, wherein X is yttrium, a lanthanide or a mixture thereof, Z is one or more alkaline earth elements, and x is a number between 0 and 1. The lanthanides of little interest are cerium, praseodymium, promethium and terbium. The preferred lanthanides are neodymium, gadolinium, dysprosium, holmium, erbium, thulium and lutetium, and the most preferred lanthanide is erbium. The alkaline earth elements of little interest are beryllium and radium. The preferred alkaline earth elements are barium and strontium, and the most preferred alkaline earth element is barium. The superconducting compounds of particular value are: $YBa_2Cu_3O_{6+x}$ and $ErBa_2Cu_3O_{6+x}$.

PREPARING AN AQUEOUS NITRATE SOLUTION

By the present invention, thin films are prepared by first forming an aqueous solution of the nitrates of the X, Z and Cu (copper) constituents of any one of the subject compounds in the X:Z:Cu stoichiometric ratio of 1:2:3. Since these nitrates are very soluble in $H_2O$ (water), such an aqueous solution of the nitrates ($NO_3$)

of X, Z and Cu (copper) can be prepared in many ways, such as the following three ways.

1. Weigh out predetermined portions of the oxide of X, the oxide (or carbonate) of Z, and cupric oxide to get the X:Z:Cu stoichiometric ratio of 1:2:3. Then dissolve and mix these weight-measured compounds in a dilute nitric acid solution composed of, for example, about 5% nitric acid and about 95% distilled or deionized water. Such a mixture forms X, Z and Cu nitrates in a molar ratio of 1:2:3, respectively, in this solution. Typically, about 3 grams of the mixture of these compounds are used per 100 milliliters of solution.

2. Dissolve and mix the compound $XZ_2Cu_3O_7$ in a dilute nitric acid solution composed of, for example, about 5% nitric acid and about 95% distilled or deionized water so that the elements X, Z and Cu are present in the solution in a molar ratio of 1:2:3, respectively. Typically, about 3 grams of the compound $XZ_2Cu_3O_7$ are used for each 100 milliliters of solution.

3. Weigh out predetermined amounts of the nitrates of X, Z and Cu to yield the X:Z:Cu stoichiometric ratio of 1:2:3. Then dissolve and mix those weight-measured amounts of the nitrates of X, Z and Cu in distilled or deionized water, in a ratio of, for example, about 3 grams per 100 milliliters of distilled or deionized water.

SPRAYING THE AQUEOUS NITRATE SOLUTION

The prepared aqueous nitrate solution is sprayed onto a substrate heated to a temperature between at least the decomposition temperature of the nitrates in the solution and the lowest temperature above the decomposition temperature at which a film will not form on the substrate. As a consequence, the water in the solution evaporates, and the remaining nitrates decompose, leaving a mixed-oxide, solid film of $XZ_2Cu_3O_y$ material on the substrate, where y is a number as yet undetermined. Typically, the nitrates in the aqueous solution decompose at temperatures of about 250° C. and above to form the $XZ_2Cu_3O_y$ film, whereas this film fails to form on the substrate at temperatures above about 800° C.

The substrate that is selected can be for example, a cubic zirconia, strontium titanate, Si or GaAs wafer or chip. While a specific substrate is not part of the method of this invention, ideally both the selected substrate and the patterned superconductive material to be grown on that substrate should have matching coefficients of thermal expansion to minimize cracks in the selected substrate during a subsequent spot-heating step. Tests indicate that some of the better substrates to be used in practicing this method may be cubic zirconia or strontium titanate because each of them appears to have a coefficient of thermal expansion which substantially matches that of the desired patterned superconductive material $XZ_2Cu_3O_{6+x}$ to be grown by this method.

In operation, the spraying step could be accomplished in the following manner.

The selected substrate is mounted on a heated substrate support. The substrate support may be made of a metal such as copper. The substrate is heated to a temperature between about 250° C. and about 800° C. by a conventional substrate heater attached to the substrate support. Preferably, the substrate is heated to about 400° C. or between about 300° C. and 700° C.

The mixed aqueous nitrate solution of $X(NO_3)_3$, $Z(NO_3)_2$ and $Cu(NO_3)_2$ is placed in a suitable sprayer. The sprayer is then operated to spray the aqueous nitrate solution onto the heated substrate to cover the surface of the substrate. When the sprayed aqueous nitrate solution contacts the heated substrate, the water in the solution evaporates, depositing the nitrates $X(NO_3)_3$, $Z(NO_3)_2$ and $Cu(NO_3)_2$ on the substrate surface. Almost simultaneously with the evaporation of the water, these nitrates decompose into voltaile oxides of nitrogen which, along with the evaporated water, are driven off. As a result, a thin oxide film of $XZ_2Cu_3O_y$ material is left on the substrate. This thin oxide film of $XZ_2Cu_3O_y$ is then allowed to cool down to room temperature.

The thickness of this thin oxide film can be between 1 and 25 micrometers or even more, but typically is between 4 and 5 micrometers. The y in $XZ_2Cu_3O_y$ is a number as yet undetermined. If that resultant thin oxide film of $XZ_2Cu_3O_y$ were studied with x-ray defraction to characterize it, an orthorhombic phase of X, Z and Cu oxides would be discovered. This orthorhombic phase is not yet at the 1:2:3 superconducting phase except that the superconducting phase will be present when spraying at the higher substrate temperatures.

The thickness of the $XZ_2Cu_3O_y$ film on the substrate could be controlled by using a suitable sprayer which meters the spray density and spray time. Thus, the duration of the spraying time for a preselected concentration of the sprayed solution and a preselected spray density would determine the thickness of the resultant $XZ_2Cu_3O_y$ film on the substrate.

SPOT-HEATING A PATTERNED AREA OF $XZ_2Cu_3O_y$ FILM

A preselected patterned area of the $XZ_2Cu_3O_y$ film is then spot-heated to a temperature between about 800° C. and 950° C. in an oxygen-rich atmosphere, preferably in pure oxygen, to optimize the oxygen content of the heated patterned area of film in order to form a patterned superconductive film of $XZ_2Cu_3O_{6+x}$ on the substrate. Here x is a number between 0 0 and 1.

In a preferred operation, the patterned superconductive film of $XZ_2Cu_3O_{6+x}$ is formed on the substrate in the following manner.

A preselected pattern is written onto the $XZ_2Cu_3O_y$ film on the substrate by selectively spot-heating preselected portions of the film by means of an energy beam. This energy beam could be a laser beam, an electron beam, an infrared beam or any other energy beam which could impart heat onto a preselected patterned area of the $XZ_2Cu_3O_y$ film. Such energy beam could be applied to the preselected patterned area of the $XZ_2Cu_3O_y$ film by selectively scanning a focused beam onto the film according to the preselected pattern or by using a reflecting mask to form the preselected pattern on the film.

However, the energy beam being selectively used must have sufficient energy to raise the surface temperature of the heated portions of the $XZ_2Cu_3O_y$ film to between 800° C. and 950° C. (and preferably between about 800° C. and 850° C.) for a time duration of about 1 to 5 minutes (and preferably for about 1.5 to 2 minutes). In this manner, the spot heated portions of $XZ_2Cu_3O_y$ film, which form the preselected pattern, are converted into a superconducting material in a orthorhombic crystal structure. When the oxygen-rich atmosphere is pure oxygen, the oxygen content of the superconductive film is increased, causing the superconductive film of $XZ_2Cu_3O_{6+x}$ to be formed on the heated portions of the film. The superconductive material $XZ_2Cu_3O_{6+x}$ on the substrate was then allowed to cool down to room temperature.

REMOVING THE UNHEATED $XZ_2Cu_3O_y$ MATERIAL

As described above, the spot-heated or reacted portions of the $XZ_2Cu_3O_y$ film are converted to the superconductive thin film of $XZ_2Cu_3O_{6+x}$ material. On the other hand, the unheated or unreacted portions of the $XZ_2Cu_3O_y$ film remain $XZ_2Cu_3O_y$ material. These reacted portions of now $XZ_2Cu_3O_{6+x}$ material have a lower solubility than the unreacted portions of $XZ_2Cu_3O_y$ material. Hence, the unreacted $XY_2Cu_3O_y$ material on the substrate can be removed by a solvent such as water. It could also be dissolved in a dilute acid solution to form soluble compounds that are readily removable. The acid may be buffered to selectively leave the superconducting material unetched. Alternatively, chelating agents may be used to selectively remove unreacted oxides.

When the unreacted $XZ_2Cu_3O_y$ material is removed from the substrate, only the desired, patterned thin film of superconductive material $XZ_2Cu_3O_{6+x}$ remains on the substrate for subsequent use as superconducting interconnects or conductors.

The general nature of the invention having been set forth, the following example is presented as a specific illustration of the practice thereof. It is understood that the invention is not limited to the example but is susceptible to different modifications that would be recognized by one of ordinary skill in the art.

EXAMPLE 1

Preparation of a patterned superconductive thin film of $YBa_2Cu_3O_{6+x}$ on a cubic zirconia substrate.

An aqueous nitrate solution was prepared by initially dissolving 2.1226 grams of yttrium oxide ($Y_2O_3$), 7.4200 grams of barium carbonate ($BaCO_3$) and 4.4864 grams of copper oxide (CuO) in a solution consisting of 24 milliliters (ml) of concentrated nitric acid ($HNO_3$) and 430 ml of deionized water to produce an aqueous nitrate solution. The solution was further diluted by mixing in a sufficient amount of additional deionized water to make a total volume of 500 ml of aqueous nitrate solution.

A cubic zirconia substrate was mounted on a substrate support and heated to a temperature of about 400° C. by a substrate heater. An air brush sprayer was then used to spray the mixed aqueous nitrate solution onto the heated substrate. When the sprayed aqueous nitrate solution contacted the heated substrate, the water in the solution evaporated and the nitrates decomposed into volatile oxides of nitrogen which, along with the evaporated water, were driven away from the substrate. A thin oxide film of $YBa_2Cu_3O_y$ was left on the substrate. (The y in this $YBa_2Cu_3O_y$ film represents an undefined number.) The substrate containing this thin oxide film of $YBa_2Cu_3O_y$ was removed from the substrate heater to allow the $YBa_2Cu_3O_y$ film to cool to room temperature.

After the $YBa_2Cu_3O_y$ on the substrate had cooled to room temperature, the substrate was put in a quartz ampoule. The quartz ampoule was then filled with pure oxygen. The film was selectively spot-heated for about 2 minutes by scanning a focused laser beam from an excimer laser through an optical window in the quartz ampoule onto portions of the film according to a preselected pattern. The laser beam energy was sufficient to raise the surface temperature of the scanned portions of the film to between 800° C. and 950° C. (to be explained). The substrate containing the film was allowed to cool to about room temperature before it was removed from the ampoule.

The substrate containing the film was then dipped into a dilute nitric acid solution composed of 50 cubic centimeters (cc) of concentrated nitric acid and 50 cc of distilled water to dissolve away the unheated or unreacted portions of the film, which were more soluble than the spot-heated or reacted portions of the film. Next the substrate was rinsed in distilled water to remove any traces of nitric acid. The remaining patterned portion of the film (which had been heated) was then subjected to a powder diffraction scan produced by an x-ray and found to have the orthorhombic crystalline structure of the superconducting phase of $YBa_2Cu_3O_{6+x}$. Here x is a number between 0 and 1.

Experiments have indicated that the superconducting phase of $YBa_2Cu_3O_{6+x}$ does not form below 800° C. and degenerates above 950° C. Although the exact temperature of the spot-heated portions of the film could not be measured, the temperature of the heated portions of film had to be within this 800° C. to 950° C. range in order to convert the heated portions of $YBa_2Cu_3O_y$ film to the superconducting phase of $YBa_2Cu_3O_{6+x}$, as later determined by the x-ray test.

Obviously, many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method for growing a patterned superconductive oxide film of the general formula $XZ_2Cu_3O_{6+x}$, wherein X is yttrium, a lanthanide or a mixture thereof, Z is one or more alkaline earth elements and x is a number between 0 and 1, said method comprising the steps of:

preparing an aqueous solution of the nitrates of X, Z and Cu in the X:Z:Cu stoichiometric ratio of 1:2:3;

spraying said aqueous solution onto a substrate heated to a temperature between at least the decomposition temperature of the nitrates in said solution and the lowest temperature above said decomposition temperature at which a film does not form on said substrate, thereby forming on said substrate a thin film of $XZ_2Cu_3O_y$ material, wherein y is an undefined number;

spot-heating preselected portions of said thin film of $XZ_2Cu_3O_y$ material in a substantially pure oxygen atmosphere to a temperature between 800° C. and 950° C. for a time sufficient to convert said preselected portions into a patterned superconductive oxide film $XZ_2Cu_3O_{6+x}$; and removing the unheated $XZ_2Cu_3O_y$ material in order to leave only said patterned superconductive oxide film of $XZ_2Cu_3O_{6+x}$ material on said substrate.

2. A method for growing a patterned superconductive oxide film, said method comprising the steps of;

preparing an aqueous solution of a nitrate of a first element X selected from the group consisting of yttrium and the lanthanides or a mixture thereof, a nitrate of a second element Z selected from the group consisting of the alkaline earths, and the nitrate of copper in the X:Z:Cu stoichiometric ratio of 1:2:3;

spraying said aqueous solution onto a substrate heated to a temperature between at least the decomposition temperature of the nitrates in said solution and the lowest temperature above said decomposition temperature at which a film does not form on said substrate, thereby forming on said substrate a thin film of $XZ_2Cu_3O_y$ material, wherein y is an undefined number;

spot-heating preselected portions of said thin film of $XZ_2Cu_3O_y$ material in an oxygen-rich atmosphere to a temperature between 800° C. and 950° C. for a time sufficient to convert said preselected portions into a patterned superconductive oxide film of $XZ_2Cu_3O_{6+x}$, wherein x is a number between 0 and 1; and removing the unheated $XZ_2Cu_3O_y$ material in order to leave only said patterned superconductive oxide film of $XZ_2Cu_3O_{6+x}$ on said substrate.

3. The method of claim 2 wherein:

during said spraying step said substrate is heated to a temperature between about 250° C. and about 800° C. to form said thin film of $XZ_2Cu_3O_y$ material on said substrate; and during said spot-heating step said preselected portions are heated to the temperature between about 800° C. and about 950° C. for a time duration of between 1 to 5 minutes.

4. The method of claim 3 wherein:

said oxygen-rich atmosphere is an atmosphere of substantially pure oxygen.

5. The method of claim 3 wherein:

during said spraying step said substrate is heated to a temperature of between about 300° C. and about 500° C.

6. The method of claim 5 wherein:

during said spraying step said substrate is heated to a temperature of about 400° C.

7. The method of claim 2 wherein said spot-heating step includes the step of:

directing an energy beam onto said $XZ_2Cu_3O_y$ film according to a preselected pattern to form said patterned superconductive oxide film of $XZ_2Cu_3O_{6+x}$ on said substrate.

8. The method of claim 2 wherein said spot-heating step includes the steps of:

placing a reflecting mask containing a preselected pattern on said $XZ_2Cu_3O_y$ film; and applying heat to the exposed portions of said $XZ_2Cu_3O_y$ film to convert said exposed portions to said patterned superconductive oxide film $XZ_2Cu_3O_{6+x}$ on said substrate.

9. The method of claim 2 wherein:

during said spot-heating step said preselected portions are heated in an atmosphere of substantially pure oxygen to a temperature between about 800° C. and about 850° C. for a time duration of about 2 minutes.

10. The method of claim 2 wherein said removing step includes the step of:

dissolving the unheated $XZ_2Cu_3O_y$ material with a solvent.

11. The method of claim 10 wherein:

said solvent is water.

12. The method of claim 10 wherein:

said solvent is a dilute solution of acid and distilled water to selectively remove said $XZ_2Cu_3O_y$ material without etching said film of $XZ_2Cu_3O_{6+x}$ on said substrate.

13. The method of claim 2 wherein:

said nitrate of said first element X is selected from the group consisting of yttrium, lanthanium, neodynium, samarium, europium, gadolinium, dysprosium, holmium, erbium, thulium, ytterbium and lutetium and said nitrate of said second element Z is selected from the group consisting of barium, strontium, calcium and magnesium.

14. The method of claim 13 wherein:

during said spraying step said substrate is heated to a temperature between about 250° C. and about 800° C. to form said thin film of $XZ_2Cu_3O_y$ material on said substrate; and during said spot-heating step said preselected portions are heated to a temperature between about 800° C. and about 950° C. for a time duration of between 1 to 5 minutes.

15. The method of claim 14 wherein:

during said spraying step said substrate is heated to a temperature of between about 300° C. and about 500° C.

16. The method of claim 15 wherein:

during said spraying step said substrate is heated to a temperature of about 400° C.; and during said spot-heating step said preselected portions are heated to a temperature between about 800° C. and about 850° C. for about 2 minutes.

17. The method of claim 14 wherein said spot-heating step includes the step of:

directing an energy beam onto said $XZ_2Cu_3O_y$ film according to a preselected pattern to form said patterned superconductive oxide film of $XZ_2Cu_3O_{6+x}$ on said substrate.

18. The method of claim 14 wherein said spot-heating step includes the steps of:

placing a reflecting mask containing a preselected pattern on said $XZ_2Cu_3O_y$ film; and applying heat to the exposed portions of said $XZ_2Cu_3O_y$ film to convert said exposed portions to said patterned superconductive oxide film $XZ_2Cu_3O_{6+x}$ on said substrate.

19. The method of claim 14 wherein said removing step includes the step of:

dissolving the unheated $XZ_2Cu_3O_y$ material with a solvent.

20. The method of claim 2 wherein:

said nitrate of said first element X is selected from the group consisting of yttrium, neodymium, gadolinium, dysprosium, holmium, erbium, thulium and lutetium and said nitrate of said second element Z is selected from the group consisting of barium and strontium.

21. The method of claim 20 wherein:

said substrate is heated to a temperature between about 300° C. and about 700° C. to form said thin film of $XZ_2Cu_3O_y$ material on said substrate; and said preselected portions are heated to a temperature between about 800° C. and about 950° C. for a time duration of between 1 to 5 minutes.

22. The method of claim 21 wherein said spot-heating step includes the step of:

directing an energy beam onto said $XZ_2Cu_3O_y$ film according to a preselected pattern to form said patterned superconductive oxide film of $XZ_2Cu_3O_{6+x}$ on said substrate.

23. The method of claim 21 wherein:

said substrate is heated to a temperature of between about 300° C. and about 500° C.

24. The method of claim 23 wherein:

said substrate is heated to a temperature of about 400° C.

25. The method of claim 23 wherein said removing step includes the step of:

dissolving the unheated $XZ_2Cu_3O_y$ material with a solvent.

26. The method of claim 25 wherein:
said nitrate of said second element Z is barium.

27. The method of claim 26 wherein:
said nitrate of said first element X is selected from the group consisting of yttrium and erbium.

* * * * *